United States Patent
Lin et al.

(10) Patent No.: US 8,558,822 B2
(45) Date of Patent: Oct. 15, 2013

(54) LIQUID CRYSTAL DISPLAY

(75) Inventors: Lin Lin, Tai Chung (TW); Wen-Hung Wang, Tai Chung (TW); Shyh-Jeng Chen, Tai Chung County (TW)

(73) Assignee: Wintek Corporation, Taichung (TW)

( * ) Notice: Subject to any disclaimer, the term of this patent is extended or adjusted under 35 U.S.C. 154(b) by 841 days.

(21) Appl. No.: 12/717,413

(22) Filed: Mar. 4, 2010

(65) Prior Publication Data
US 2010/0225626 A1    Sep. 9, 2010

(30) Foreign Application Priority Data
Mar. 5, 2009 (TW) ............................. 98107056 A

(51) Int. Cl.
*G06F 3/038* (2013.01)

(52) U.S. Cl.
USPC ........... 345/205; 345/100; 345/211; 345/204; 349/40; 349/106

(58) Field of Classification Search
USPC .............. 345/205, 98, 211, 204, 100; 349/40, 349/106
See application file for complete search history.

(56) References Cited

U.S. PATENT DOCUMENTS

| 5,650,597 A * | 7/1997 | Redmayne ................. 178/18.06 |
| 6,088,073 A * | 7/2000 | Hioki et al. ..................... 349/40 |
| 2008/0165301 A1* | 7/2008 | Chang et al. .................... 349/40 |

FOREIGN PATENT DOCUMENTS

| CN | 101231398 A | 7/2008 |
| CN | 101281314 A | 10/2008 |
| TW | 200802287 A | 1/2008 |

* cited by examiner

*Primary Examiner* — Lun-Yi Lao
*Assistant Examiner* — Sosina Abebe
(74) *Attorney, Agent, or Firm* — Muncy, Geissler, Olds & Lowe, PLLC

(57) ABSTRACT

A liquid crystal display includes an array substrate, a color filter substrate facing the array substrate, and a liquid crystal layer provided between the array substrate and the color filter substrate. The array substrate includes a driving device, at least one conductive wiring, and a transient voltage suppressor. The driving device includes a driver. The driver has at least one common voltage terminal. The conductive wiring has a connection point and is coupled to the common voltage terminal of the driver. The transient voltage suppressor is coupled to a ground terminal and the connection point, and the connection point is near the common voltage terminal.

9 Claims, 4 Drawing Sheets

LIQUID CRYSTAL DISPLAY

BACKGROUND OF THE INVENTION (a) Field of the Invention

The invention relates to an array substrate and a liquid crystal display having the function of electrostatic discharge protection, particularly to an array substrate and a liquid crystal display having the function of electrostatic discharge protection by using a transient voltage suppressor (TVS).

(b) Description of the Related Art

In general, a liquid crystal display includes an array substrate, a color filter substrate, and a liquid crystal layer. The color filter substrate faces the array substrate and the liquid crystal layer is located between the two substrates. FIG. 1 shows a top-view illustrating the array substrate of a conventional liquid crystal display. The array substrate 10 includes a substrate 11, a pixel array 15, a driving device, and at least one conductive wiring 13 provided on the substrate 11. The driving device includes a driver 12 and a driving circuit 14. The pixel array 15 is coupled to the driving circuit 14 of the driving device. The driving circuit 14 drives and controls the pixel array 15 to display an image. The conductive wiring 13 is coupled to the driving device and a common electrode (not shown) on the color filter substrate. The driving device provides a common voltage (Vcom) to the common electrode on the color filter substrate as a reference voltage for the pixel array 15. Generally, the conductive wiring 13 is provided in a non-active display region 17 on which no pixel array 15 is formed, and the non-active display region 17 usually surrounds the pixel array 15.

The conductive wiring 13 is coupled to the driving device, and thus the electrostatic surges formed by electrostatic charges from the substrate 11 may enter the driving device through the conductive wiring 13 to damage the driving device. In order to prevent the display device from being damaged by electrostatic charges, in conventional designs, an electrostatic discharge protection circuit (not shown) is provided on the substrate 11 and coupled to the conductive wiring 13. However, accompanying with the advance in the technology of the driving device, the driving device becomes highly integrated and compact and is made by fine fabrication processes to thereby open a strong possibility of being damaged by electrostatic charges. Thus, the conventional design of an electrostatic discharge protection circuit becomes unsuitable nowadays.

BRIEF SUMMARY OF THE INVENTION

In light of the above-mentioned problem, one object of the invention is to provide an array substrate or a liquid crystal display having the function of electrostatic discharge protection to decrease the possibility that electrostatic charges damage the driving device and increase the life time of the driving device as a result.

According to an embodiment of the invention, a liquid crystal display includes an array substrate, a color filter substrate facing the array substrate, and a liquid crystal layer provided between the array substrate and the color filter substrate. The array substrate comprises a driving device, a first conductive wiring, a second conductive wiring, a first transient voltage suppressor, and a second transient voltage suppressor. The driving device is provided on the array substrate and comprises a driver. The driver has at least one common voltage terminal (VCOM terminal), for example, a first common voltage terminal and a second common voltage terminal for outputting a common voltage. The array substrate is provided with at least one conductive wiring. For example, a first conductive wiring and a second conductive wiring are provided on the array substrate. The first conductive wiring comprises a first connection point and is coupled to the first common voltage terminal of the driving device, and the second conductive wiring comprises a second connection point and is coupled to the second common voltage terminal of the driving device. The array substrate is provided with at least one transient voltage suppressor. For example, a first transient voltage suppressor and a second transient voltage suppressor that are both coupled to a ground terminal are couple to the first connection point and the second connection point, respectively. In addition, the first transient voltage suppressor is coupled to the driver of the driving device through the first connection point of the first conductive wiring, and the first connection point is near the first common voltage terminal. The second transient voltage suppressor is coupled to the driver of the driving device through the second connection point of the second conductive wiring, and the second connection point is near the second common voltage terminal.

In one embodiment, the first transient voltage suppressor and the second transient voltage suppressor are separately provided on the array substrate.

The liquid crystal display according to one embodiment of the invention further comprises a flexible printed circuit board, and the first transient voltage suppressor and the second transient voltage suppressor are provided on the flexible printed circuit board.

In one embodiment, the voltage provided by the first transient voltage suppressor and the second transient voltage suppressor under a cut-off state is smaller than the sustained voltage of the driver. In one embodiment, the sustained voltage for the first transient voltage suppressor and the second transient voltage suppressor under a normal state is larger than or equal to the operating voltage of the driver.

According to the above embodiments, the first and the second transient voltage suppressors are used to eliminate electrostatic energy to remedy the deficiency of conventional designs. Specifically, the transient voltage suppressors may prevent electrostatic charges from directly entering the driving device. Thus, the electrostatic energy is quickly released to a ground terminal through the transient voltage suppressors, and the whole antistatic capability of the liquid crystal display is enhanced as a result.

DETAILED DESCRIPTION OF THE INVENTION

The above and other technical content, characteristics, and effects of the invention will be described in details with reference to the drawings. For clarity, the wording related to direction, such as up, down, left, right, front, back, etc., is merely used to describe the direction with respect to the drawings but does not limit the scope of the invention.

Figure 1:
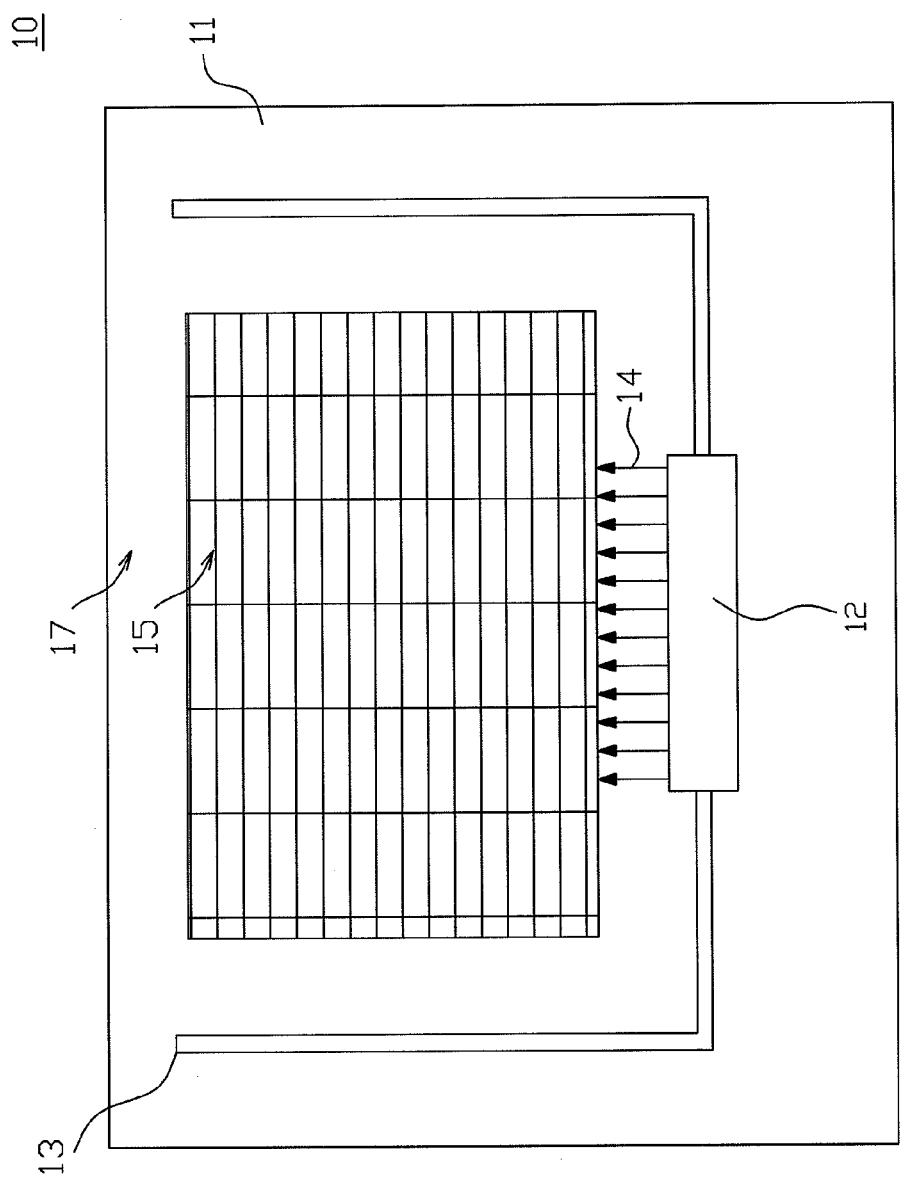
FIG. 1 shows a top-view illustrating the array substrate of a liquid crystal display according to a conventional design.
Figure 2:
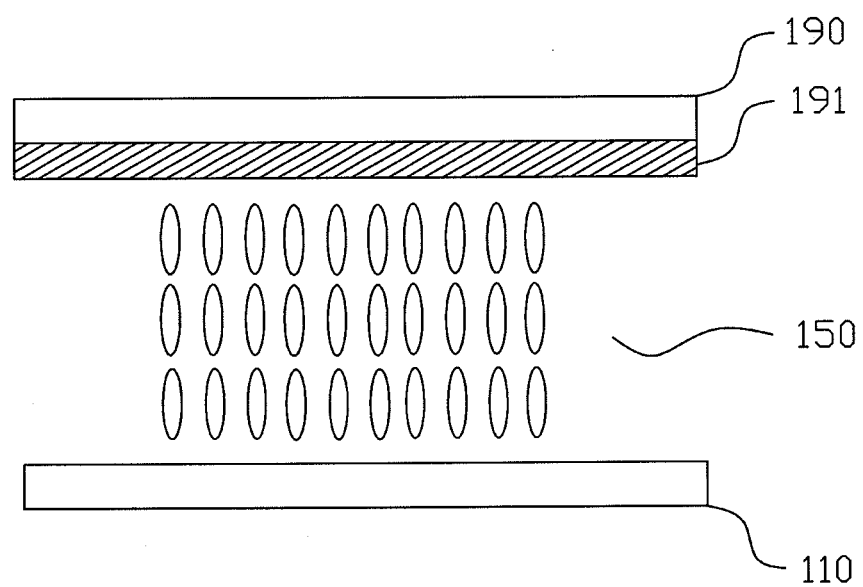
FIG. 2 shows a cross-section illustrating a liquid crystal display according to an embodiment of the invention.
Figure 3:
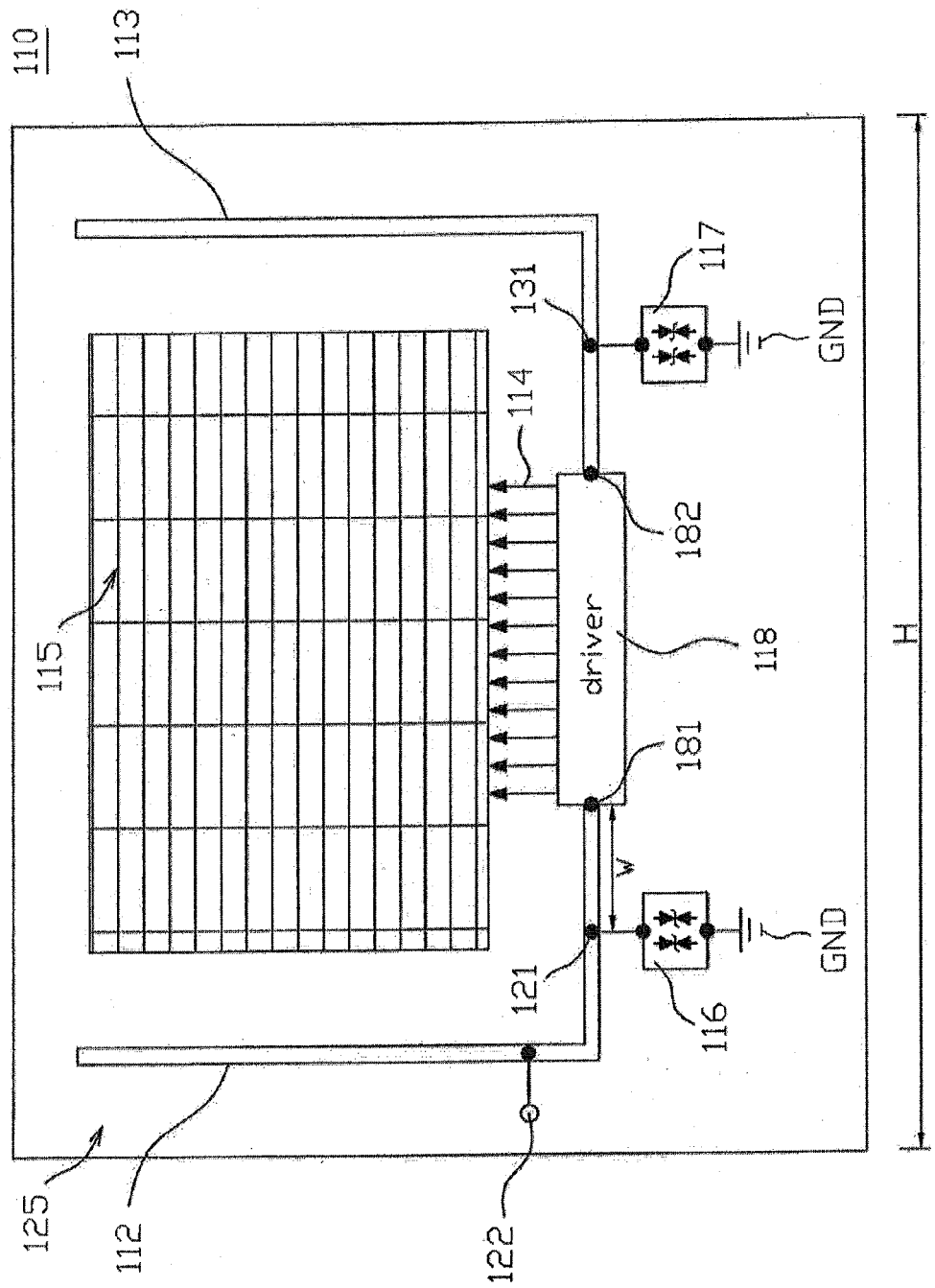
FIG. 3 shows a top-view illustrating the array substrate of the liquid crystal display according to an embodiment of the invention.

FIG. 2 shows a cross-section illustrating a liquid crystal display according to an embodiment of the invention. FIG. 3 shows a top-view illustrating the array substrate of the liquid crystal display according to an embodiment of the invention. The liquid crystal display 101 includes an array substrate 110, a color filter substrate 190, and a liquid crystal layer 150. The color filter substrate 190 faces the array substrate 110, and the liquid crystal layer 150 is provided between the substrate 190 and the substrate 110. The color filter substrate 190 has a common electrode 191. The array substrate 110 includes a pixel array 115, a driving device, a first transient voltage suppressor (TVS) 116, a second transient voltage suppressor 117, a first conductive wiring 112, and a second conductive wiring 113.

The driving device includes a driver 118 and a driving circuit 114. The driving circuit 114 of the driving device is coupled to the pixel array 115 and controls the pixel array 115 to display an image. The driver 118 has a first common voltage terminal 181 and a second common voltage terminal 182 for outputting a common voltage. The first conductive wiring 112 has a first connection point 121 and is coupled to the first common voltage terminal 181 of the driver 118. Also, the first conductive wiring 112 is coupled to the common electrode 191 on the color filter substrate 190 through a common electrode terminal 122, so that the driver 118 is allowed to provide a common voltage (Vcom) to the common electrode 191 through the first conductive wiring 112, with the common voltage serving as a reference voltage of the pixel array 115. The second conductive wiring 113 has a second connection point 131 and is coupled to the second common voltage terminal 182 of the driver 118.

The first transient voltage suppressor 116 and the second transient voltage suppressor 117 are coupled to a ground terminal GND. In addition, the first transient voltage suppressor 116 is coupled to the first connection point 121, and thus the first transient voltage suppressor 116 is allowed to be coupled to the driver 118 of the driving device through the first conductive wiring 112 and the first common voltage terminal 181. In order to achieve better electrostatic discharge protection, the first connection point 121 is as near the first common voltage terminal 181 as possible. The second transient voltage suppressor 117 is coupled to the second connection point 131, and thus the second transient voltage suppressor 117 is allowed to be coupled to the driver 118 of the driving device through the second conductive wiring 113 and the second common voltage terminal 182. In order to achieve better electrostatic discharge protection, the second connection point 131 is as near the first common voltage terminal 182 as possible.

The first conductive wiring 112 and the second conductive wiring 113 are provided in the non-active display region 125. The non-active display region 125 on the array substrate 110 is the region on which no pixel array 115 is formed, and the non-active display region 125 surrounds the pixel array 115.

Compared with the driving circuit 114, the driver 118 is more highly integrated and compact and is made by fine fabrication processes to thereby open a strong possibility of being damaged by electrostatic charges. Therefore, in this embodiment, the first transient voltage suppressor 116 and the second transient voltage suppressor 117 are provided near the driver 118. Specifically, the first connection point 121 is provided near the first common voltage terminal 181, and the second connection point 131 is provided near the second common voltage terminal 182. In one embodiment, the array substrate 110 is in the shape of a rectangle comprising four sides, and the first transient voltage suppressor 116, the second transient voltage suppressor 117, and the driver 118 provided in the non-active display region 125 are on the same side of the rectangle. Preferably, part of the first conductive wiring 112 between the first connection point 121 and the first common voltage terminal 181 is formed as a straight line to shorten the distance w between the first connection point 121 and the first common voltage terminal 181. Also, part of the second conductive wiring 113 between the second connection point 131 and the second common voltage terminal 182 is formed as a straight line to shorten the distance w between the second connection point 131 and the second common voltage terminal 182. As the length of the side where the first transient voltage suppressor 116, the second transient voltage suppressor 117, and the driver 118 are located is H, the shortest distance w is preferably smaller than ¼ of the length H.

As the array substrate 110 generates electrostatic charges, the electrostatic surges due to the electrostatic charges may enter the driver 118 easily through the first conductive wiring 112. Hence, according to the above embodiment, the first transient voltage suppressor 116 is coupled to the first connection point 112, and, before the electrostatic charges enter the driver 118 through the first conductive wiring 112, the electrostatic charges pass the first conductive wiring 112 and are delivered to the first transient voltage suppressor 116 and finally to the ground terminal GND. Thus, the damage to the driver 118 as a result of electrostatic charges is avoided. More specifically, as the transient voltage of electrostatic surges is larger than the normal operating voltage of the driver 118 protected by the first transient voltage suppressor 116, the first transient voltage suppressor 116 breaks down to provide a conduction path with a super low resistance. Thus, the transient current of the electrostatic surges is led by the first transient voltage suppressor 116 and flows into the ground terminal GND but not the driver 118. In addition, the first common voltage terminal 181 of the driver 18 keeps at a cut-off voltage of the first transient voltage suppressor 116 until the transient voltage recovers to the normal operating voltage. After the transient pulse passes by, the first transient voltage suppressor 116 automatically goes back to a high-resistance state, and thus the whole circuit is turned to have a normal operating voltage.

More specifically, the sustained voltage Vwm of the first transient voltage suppressor 116 under a normal state (no electrostatic surges) should be larger than or equal to the operating voltage of the driver 118, otherwise the first transient voltage suppressor 116 may always cut off the loop. Preferably, the sustained voltage Vwm is as close to the operating voltage of the driver 118 as possible. Thus, the driver 118 is not damaged by electrostatic surges before the first transient voltage suppressor 116 starts to function. Besides, the voltage Vc provided by the first transient voltage suppressor 116 under a cut-off state (the voltage of one end of the first transient voltage suppressor 116 near the first connection point 121 and is measured when electrostatic surges pass the first transient voltage suppressor 116) is smaller than the sustained voltage of the driver 118, otherwise the driver 118 is easily damaged.

Compared with conventional designs, the above embodiments not only simplifies the electrostatic discharge protection structure of an array substrate but also increases the antistatic capability by providing a shortest distance between the first connection point 121 and the first common voltage terminal 181.

Besides, except a complicated configuration, the conventional design often uses an amorphous silicon diode. An amorphous silicon diode has the following disadvantages. First, the slope of the characteristic curve of an amorphous silicon diode is so large that the forward resistance exceeds about 5 KΩ and the switching speed is of millisecond (ms) order, but the occurrence of an electrostatic surge is of nano second (ns) order. Thus, the amorphous silicon diode has less capability to protect the driver 118. The first transient voltage suppressor 116 used by this embodiment has a conducting resistance of about 10Ω and can successfully eliminate electrostatic energy. The first transient voltage suppressor 116 has a higher switching speed and a lower forward resistance to reduce the impact of using the amorphous silicon diode and prevent the electrostatic charges from directly entering the driver 118. The electrostatic energy is released to ground through the first transient voltage suppressor 116 within a very short period of time. Therefore, the total antistatic capability of the liquid crystal display 101 is improved.

In the above, the first conductive wiring 112, the first transient voltage suppressor 116, the first connection point 121, and the first common voltage terminal 181 are described in detail. As for the second conductive wiring 113, the second transient voltage suppressor 117, the second connection point 131, and the second common voltage terminal 182, the technique is the same as the above and thus those who are skilled in the art should understand and derive by analogy. Therefore, their details will not be given hereinafter.

Figure 4:
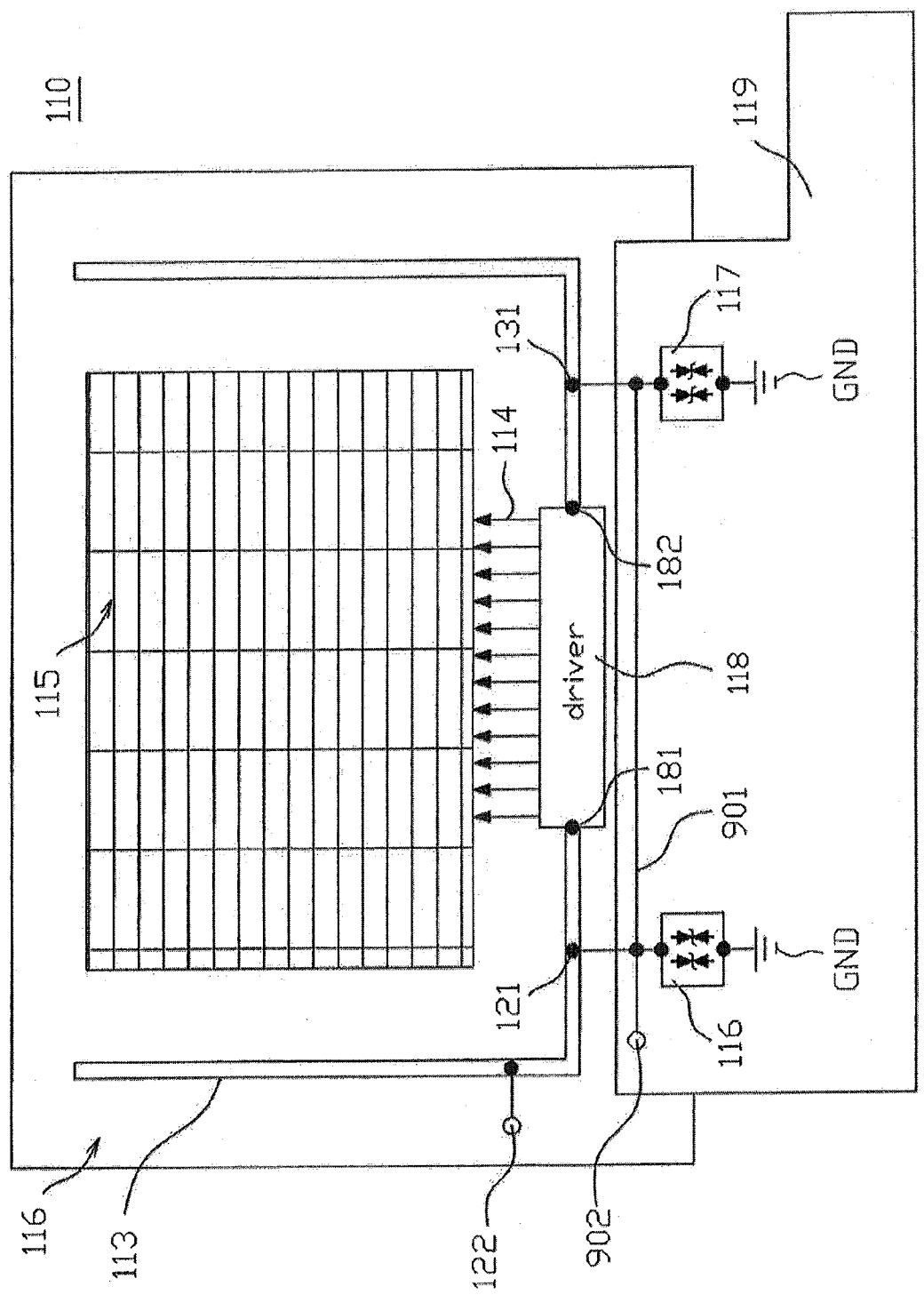
FIG. 4 shows a schematic diagram illustrating a top-view illustrating a liquid crystal display according to another embodiment of the invention.

FIG. 4 shows a schematic diagram illustrating a top-view illustrating a liquid crystal display according to another embodiment of the invention. The embodiment shown in FIG. 4 is similar to that shown in FIG. 3. Thus, the same element is indicated by the same numeral and its description is omitted. The following will only describe the differences between the two embodiments.

In this embodiment, the liquid crystal display 101 further comprises a flexible printed circuit board 119. The first transient voltage suppressor 116 and the second transient voltage suppressor 117 are not provided on the array substrate 110 but on the flexible printed circuit board 119. Furthermore, the flexible printed circuit board 119 further comprises an auxiliary wiring 901. The auxiliary wiring 901 may be provided on the flexible printed circuit board 119. The auxiliary wiring 901 is coupled between the first transient voltage suppressor 116 and the first connection point 121 and between the second transient voltage suppressor 117 and the second connection point 131. In addition, the auxiliary wiring 901 is coupled to a common electrode terminal 902. The auxiliary wiring 901 is coupled to the common electrode 191 of the color filter substrate 190 through the common electrode terminal 902. The following shows an experiment on the liquid crystal display 101 where the first transient voltage suppressor 116 and the second transient voltage suppressor 117 is provided, and the experiment result is compared with that of a liquid crystal display without any transient voltage suppressor (control group). The experiment result is shown in Table I.

TABLE I

|  | Panel positive voltage discharge | Panel negative voltage discharge |
| --- | --- | --- |
| Control group | +5 KV | — |
| This embodiment | +8 KV | −7.5 KV |

As shown in Table I, the liquid crystal display without any transient voltage suppressor (control group) can sustain a positive discharge of only +5 KV while the liquid crystal display 101 according to this embodiment can sustain a positive discharge of +8 KV. In addition, the liquid crystal display 101 according to this embodiment can sustain a negative discharge of −7.5 KV. Therefore, compared to the conventional design, the liquid crystal display 101 according to this embodiment has better electrostatic discharge protection.

Although the present invention has been fully described by the above embodiments, the embodiments should not constitute the limitation of the scope of the invention. Various modifications or changes can be made by those who are skilled in the art without deviating from the spirit of the invention. Any embodiment or claim of the present invention does not need to reach all the disclosed objects, advantages, and uniqueness of the invention. Besides, the abstract and the title are only used for assisting the search of the patent documentation and should not be construed as any limitation on the implementation range of the invention.

What is claimed is:

1. A liquid crystal display, comprising:
an array substrate;
a color filter substrate facing the array substrate;
a liquid crystal layer provided between the array substrate and the color filter substrate;
a driving device provided on the array substrate and comprising a driver, the driver having a first common voltage terminal and a second common voltage terminal for outputting a common voltage;
a first conductive wiring and a second conductive wiring provided on the array substrate, wherein the first conductive wiring is disposed on a first side and within a non-active display region of the array substrate, the second conductive wiring is disposed on a second side and within a non-active display region of the array substrate, the second side is opposite the first side, the first conductive wiring comprises a first connection point and is coupled to the first common voltage terminal of the driving device, and the second conductive wiring comprises a second connection point and is coupled to the second common voltage terminal of the driving device; and
a first transient voltage suppressor and a second transient voltage suppressor both coupled to a ground terminal, the first transient voltage suppressor being coupled to the first conductive wiring on the first side through the first connection point, and the second transient voltage suppressor being coupled to the second conductive wiring on the second side through the second connection point;
wherein the first transient voltage suppressor is coupled to the driver of the driving device through the first connection point of the first conductive wiring, the first connection point is near the first common voltage terminal, the second transient voltage suppressor is coupled to the driver of the driving device through the second connection point of the second conductive wiring, and the second connection point is near the second common voltage terminal.

2. The liquid crystal display according to claim 1, further comprising a pixel array, and wherein the driving device further comprises a driving circuit coupled to the pixel array for controlling the pixel array.

3. The liquid crystal display according to claim 2, wherein the non-active display region surrounding the pixel array, and the first transient voltage suppressor, the second transient voltage suppressor, and the driver are all located in the non-active display region.

4. The liquid crystal display according to claim 2, wherein the first transient voltage suppressor, the second transient voltage suppressor, and the driver are all located on the same side of the array substrate.

5. The liquid crystal display according to claim 4, wherein the distance between the first transient voltage suppressor and the first common voltage terminal is less than ¼ of the length of the side of the array substrate.

6. The liquid crystal display according to claim 2, wherein the array substrate is connected to a flexible printed circuit board, and the first transient voltage suppressor and the second transient voltage suppressor are both located on the flexible printed circuit board.

7. The liquid crystal display according to claim 6, wherein the flexible printed circuit board further comprises an auxiliary wiring, and the auxiliary wiring is coupled between the first transient voltage suppressor and the first connection point, coupled between the second transient voltage suppressor and the second connection point, and coupled to a common electrode terminal.

8. The liquid crystal display according to claim 1, wherein the sustained voltage of the first transient voltage suppressor and the second transient voltage suppressor under a normal state is larger than or equal to the operating voltage of the driver.

9. The liquid crystal display according to claim 1, wherein the voltage provided by the first transient voltage suppressor and the second transient voltage suppressor under a cutoff state is smaller than the sustained voltage of the driver.

* * * * *